(12) United States Patent
Nagasawa et al.

(10) Patent No.: US 12,249,359 B2
(45) Date of Patent: Mar. 11, 2025

(54) MAGNETIC SENSOR, MAGNETIC HEAD, AND MAGNETIC RECORDING DEVICE

(71) Applicant: KABUSHIKI KAISHA TOSHIBA, Tokyo (JP)

(72) Inventors: Tazumi Nagasawa, Yokohama Kanagawa (JP); Satoshi Shirotori, Yokohama Kanagawa (JP); Akira Kikitsu, Yokohama Kanagawa (JP); Yoshihiro Higashi, Komatsu Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 18/359,959

(22) Filed: Jul. 27, 2023

(65) Prior Publication Data

US 2024/0135967 A1 Apr. 25, 2024
US 2024/0233760 A9 Jul. 11, 2024

(30) Foreign Application Priority Data

Oct. 21, 2022 (JP) ................................. 2022-169281

(51) Int. Cl.
*G11B 5/39* (2006.01)
*G01R 33/07* (2006.01)

(52) U.S. Cl.
CPC ............ *G11B 5/3912* (2013.01); *G01R 33/07* (2013.01)

(58) Field of Classification Search
None
See application file for complete search history.

(56) References Cited

U.S. PATENT DOCUMENTS

| | | | |
|---|---|---|---|
| 7,576,948 B2 | 8/2009 | Covington et al. | |
| 8,174,799 B2 | 5/2012 | Hoshiya et al. | |
| 8,390,963 B2 | 3/2013 | Dimitrov et al. | |
| 8,879,213 B2 * | 11/2014 | Isowaki | G11B 5/11 360/319 |
| 9,293,160 B1 * | 3/2016 | Mihajlovic | G11B 5/37 |
| 11,170,808 B1 | 11/2021 | Liu et al. | |
| 2006/0044701 A1 * | 3/2006 | Funayama | G11B 5/3903 |
| 2015/0221327 A1 * | 8/2015 | Isowaki | H10N 50/01 29/428 |
| 2020/0075048 A1 * | 3/2020 | Yamagishi | G11B 5/35 |
| 2024/0135961 A1 * | 4/2024 | Nagasawa | G11B 5/1272 |
| 2024/0135962 A1 * | 4/2024 | Nakagawa | G11B 5/1278 |
| 2024/0257829 A1 * | 8/2024 | Shirotori | G11B 5/11 |

* cited by examiner

*Primary Examiner* — William J Klimowicz
(74) *Attorney, Agent, or Firm* — Finnegan, Henderson, Farabow, Garrett & Dunner, LLP

(57) ABSTRACT

According to one embodiment, a magnetic sensor includes first to fourth shields, a first magnetic layer, first and second conductive layers, and first and second intermediate layer. The first magnetic layer is between the third shield and the fourth shield. The first magnetic layer includes a first face and a second face. The first face is between the first shield and the second face. The first conductive layer is provided between the third shield and the first magnetic layer. The second conductive layer is provided between the first magnetic layer and the fourth shield. The first intermediate layer is provided between the first shield and the first magnetic layer. The first intermediate layer includes a first intermediate layer face facing the first face. An area of the first intermediate layer face is smaller than an area of the first face.

23 Claims, 7 Drawing Sheets

MAGNETIC SENSOR, MAGNETIC HEAD, AND MAGNETIC RECORDING DEVICE

CROSS-REFERENCE TO RELATED APPLICATIONS

This application is based upon and claims the benefit of priority from Japanese Patent Application No. 2022-169281, filed on Oct. 21, 2022; the entire contents of which are incorporated herein by reference.

FIELD

Embodiments of the invention generally relate to a magnetic sensor, a magnetic head, and a magnetic recording device.

BACKGROUND

There is a magnetic sensor using a magnetic layer. Information is recorded on a magnetic recording medium such as an HDD (Hard Disk Drive) using a magnetic head including the magnetic sensor. Magnetic sensors are desired to have improved resolution.

DETAILED DESCRIPTION

Figure 1A:
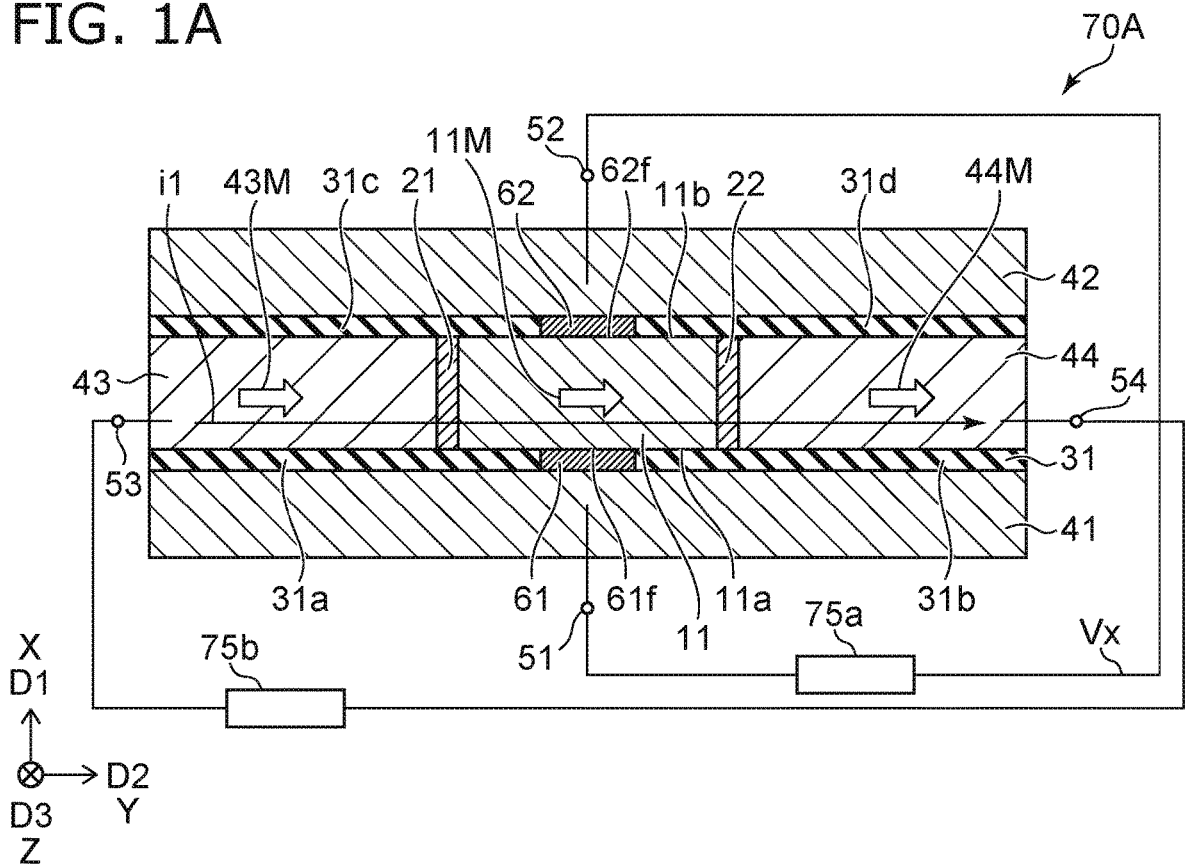
FIGS. 1A and 1B are schematic cross-sectional views illustrating a magnetic sensor according to a first embodiment.

According to one embodiment, a magnetic sensor includes a first shield, a second shield, a third shield, a fourth shield, a first magnetic layer, a first conductive layer, a second conductive layer, a first intermediate layer, and a second intermediate layer. A second direction from the third shield to the fourth shield crosses a first direction from the first shield to the second shield. The first magnetic layer is provided between the first shield and the second shield. The first magnetic layer is between the third shield and the fourth shield. The first magnetic layer includes a first face and a second face. The first face is between the first shield and the second face. The first conductive layer is provided between the third shield and the first magnetic layer. The first conductive layer is non-magnetic. The second conductive layer is provided between the first magnetic layer and the fourth shield. The second conductive layer is non-magnetic. The first intermediate layer is provided between the first shield and the first magnetic layer. The first intermediate layer is non-magnetic and electrically conductive. The first intermediate layer includes a first intermediate layer face facing the first face. An area of the first intermediate layer face is smaller than an area of the first face. The second intermediate layer is provided between the first magnetic layer and the second shield. The second intermediate layer is non-magnetic and electrically conductive.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously in an antecedent drawing are marked with like reference numerals, and a detailed description is omitted as appropriate.

First Embodiment

Figure 1B:
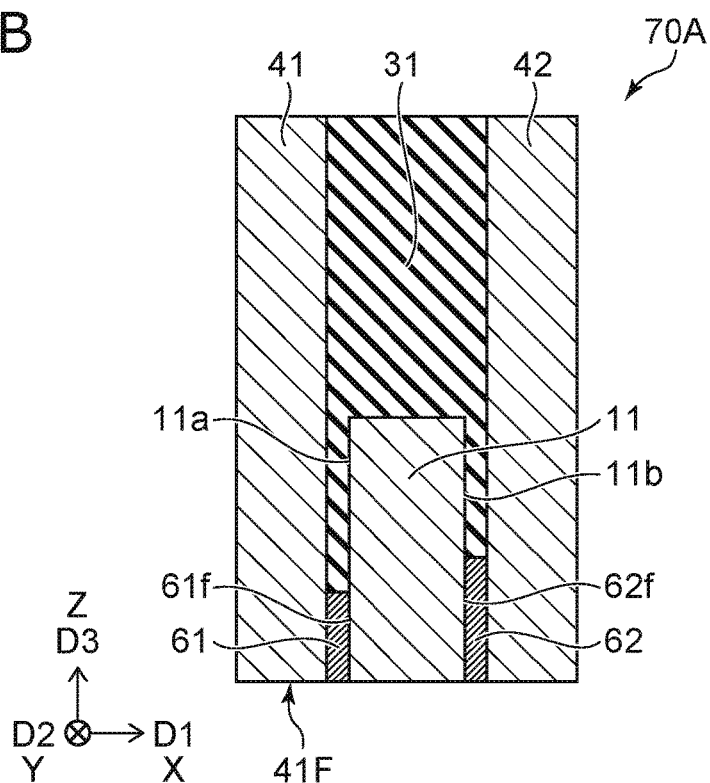

FIGS. 1A and 1B are schematic cross-sectional views illustrating a magnetic sensor according to the first embodiment.

As shown in FIG. 1A, a magnetic sensor 70A according to the embodiment includes a first shield 41, a second shield 42, a third shield 43, a fourth shield 44, a first magnetic layer 11, and a first conductive layer 21, a second conductive layer 22, a first intermediate layer 61 and a second intermediate layer 62.

A second direction D2 from the third shield 43 to the fourth shield 44 crosses a first direction D1 from the first shield 41 to the second shield 42.

In this example, the first direction D1 is defined as an X-axis direction. One direction perpendicular to the X-axis direction is defined as a Y-axis direction. A direction perpendicular to the X-axis direction and the Y-axis direction is defined as a Z-axis direction. The second direction D2 is, for example, the Y-axis direction.

The first magnetic layer 11 is provided between the first shield 41 and the second shield 42. The first magnetic layer 11 is located between the third shield 43 and the fourth shield 44. The first magnetic layer 11 includes a first face 11a and a second face 11b. The first face 11a is located between the first shield 41 and the second face 11b. The first face 11a is a face on the first shield 41 side. The second face 11b is a face on the second shield 42 side. The first face 11a faces the first shield 41. The second face 11b faces the second shield 42.

In this example, the third shield 43 is provided between a portion of the first shield 41 and a portion of the second shield 42 in the first direction D1. The fourth shield 44 is provided between another portion of the first shield 41 and another portion of the second shield 42 in the first direction D1.

The first conductive layer 21 is provided between the third shield 43 and the first magnetic layer 11. The first conductive layer 21 is non-magnetic. The second conductive layer 22 is provided between the first magnetic layer 11 and the fourth shield 44. The second conductive layer 22 is non-magnetic.

The first intermediate layer 61 is provided between the first shield 41 and the first magnetic layer 11. The first intermediate layer 61 is non-magnetic and electrically conductive. The first intermediate layer 61 includes a first intermediate layer face 61*f* facing the first face 11*a*. In an embodiment, an area of the first intermediate layer face 61*f* is smaller than an area of the first face 11*a*.

The second intermediate layer 62 is provided between the first magnetic layer 11 and the second shield 42. The second intermediate layer 62 is non-magnetic and electrically conductive.

As shown in FIG. 1A, the magnetic sensor 70A may include a first terminal 51, a second terminal 52, a third terminal 53 and a fourth terminal 54. The first terminal 51 is electrically connected to the first shield 41. The second terminal 52 is electrically connected to the second shield 42. The third terminal 53 is electrically connected to the third shield 43. The fourth terminal 54 is electrically connected to the fourth shield 44.

A first current i1 can be supplied between the third terminal 53 and the fourth terminal 54. For example, the magnetic sensor 70A may include a second circuit 75*b*. The second circuit 75*b* can supply the first current i1 between the third terminal 53 and the fourth terminal 54. The first current i1 passes through the first magnetic layer 11 via the third shield 43 and the fourth shield 44.

A voltage Vx between the first terminal 51 and the second terminal 52 can be detected. For example, the magnetic sensor 70A may include a first circuit 75*a*. The first circuit 75*a* can detect a value corresponding to the voltage Vx between the first terminal 51 and the second terminal 52.

The voltage Vx between the first terminal 51 and the second terminal 52 when the first current i1 flows between the third terminal 53 and the fourth terminal 54 can change according to a detection target magnetic field.

The change in the voltage Vx is considered to be caused by, for example, a special magnetic effect occurring in the first magnetic layer 11. For example, the first magnetic layer 11 may include at least one selected from the group consisting of Co, Ni, and Fe. The first magnetic layer 11 may include, for example, at least one selected from the group consisting of $Co_2MnGa$, $CoMnAl$, and $FePt$. For example, $Co_2MnGa$ and $CoMnAl$ are Heusler alloy materials. A large change in the voltage Vx is easy to be obtained in the above materials.

Special magnetic effects associated with changes in voltage Vx may include, for example, an Anomalous Hall Effect. For example, the first magnetic layer 11 has an Anomalous Hall effect.

As described above, the voltage Vx changes according to changes in the detection target magnetic field. The change in voltage Vx occurs based on the first current i1. The first current i1 flows through the first magnetic layer 11 along the second direction D2. At this time, the first current i1 may flow through a portion of the first shield 41 via the first intermediate layer 61. When a part of the first current i1 flows through the first intermediate layer 61 and the first shield 41, the current flowing through the first magnetic layer 11 decreases. This reduces the change in voltage Vx. As a result, for example, the obtained output is reduced. For example, the detection sensitivity is decreased.

In the embodiment, the area of the first intermediate layer face 61*f* is smaller than the area of the first face 11*a*. This suppresses the part of the first current i1 from flowing through the first intermediate layer 61 and the first shield 41. The decrease in current flowing through the first magnetic layer 11 is suppressed. A large change in the voltage Vx is easy to obtain. It is easy to obtain high output. For example, high detection sensitivity can be obtained. According to the embodiments, it is possible to provide a magnetic sensor capable of improving sensitivity.

In the embodiment, having the area of the first intermediate layer face 61*f* smaller than the area of the first face 11*a* does not adversely affect detection of the voltage Vx through the first terminal 51 and the second terminal 52.

As shown in FIG. 1A, the magnetic sensor 70A may further include a first insulating member 31. The first insulating member 31 includes a first region 31*a* and a second region 31*b*. The first region 31*a* is provided between the first shield 41 and the third shield 43 and between the first shield 41 and a portion of the first magnetic layer 11. The second region 31*b* is provided between the first shield 41 and the fourth shield 44 and between the first shield 41 and another portion of the first magnetic layer 11. The area of the first intermediate layer face 61*f* can be made smaller than the area of the first face 11*a* by the portion of the first region 31*a* and the portion of the second region 31*b*.

As shown in FIG. 1A, the second intermediate layer 62 includes a second intermediate layer face 62*f*. The second intermediate layer face 62*f* faces the second face 11*b*. In this example, the area of the second intermediate layer face 62*f* is smaller than the area of the second face 11*b*. This suppresses the part of the first current i1 from flowing through the second intermediate layer 62 and the second shield 42. The decrease in current flowing through the first magnetic layer 11 is suppressed. Larger changes in voltage Vx are easier to obtain. It is easy to obtain a higher output. For example, higher detection sensitivity is obtained. A magnetic sensor capable of further improving sensitivity can be provided.

As shown in FIG. 1A, the first insulating member 31 may further include a third region 31*c* and a fourth region 31*d*. The third region 31*c* is provided between the third shield 43 and the second shield 42 and between a portion of the first magnetic layer 11 and the second shield 42. The fourth region 31*d* is provided between the fourth shield 44 and the second shield 42 and between another portion of the first magnetic layer 11 and the second shield 42.

The first insulating member 31 may include a first element including at least one selected from the group consisting of oxygen and nitrogen, and a second element including at least one selected from the group consisting of Si, Al, Ta, Hf, and Mg. The first insulating member 31 may including, for example, at least one selected from the group consisting of silicon oxide, silicon nitride, silicon oxynitride, and aluminum oxide.

FIG. 1B is a cross-sectional view along the X-Z plane passing through the first magnetic layer 11. As shown in FIG. 1B, the first shield 41 includes a first end face 41F. As will be described later, the magnetic sensor 70A may be included in the magnetic head. In this case, the first end face 41F corresponds to the medium facing face.

As shown in FIG. 1B, a third direction D3 crosses a plane including the first direction D1 and the second direction D2. The third direction D3 is, for example, the Z-axis direction. When the magnetic sensor 70A is included in the magnetic head, the third direction D3 corresponds to the height direction.

As shown in FIG. 1B, a length of the first intermediate layer face 61*f* along the third direction D3 may be different from a length of the second intermediate layer face 62*f* along the third direction D3. In the embodiment, the length of the first intermediate layer face 61*f* along the third direction D3 may be the same as the length of the second intermediate layer face 62f along the third direction D3.

As shown in FIG. 1A, a magnetization 11M of the first magnetic layer 11 may be along the second direction D2. A magnetization 43M of the third shield 43 may be along the second direction D2. A magnetization 44M of the fourth shield 44 may be along the second direction D2. The magnetization 43M and the magnetization 44M may have the same orientation as the magnetization 11M.

At least one of the first conductive layer 21 or the second conductive layer 22 may include at least one selected from the group consisting of Cu, Au, Ag, Pt, Al, Pd, Ta, Ru, Hf, W, Mo, Ir, Cr, Tb, and Rh.

At least one of the first shield 41, the second shield 42, the third shield 43 or the fourth shield 44 may include at least one selected from the group consisting of Fe, Co, and Ni.

Figure 2A:
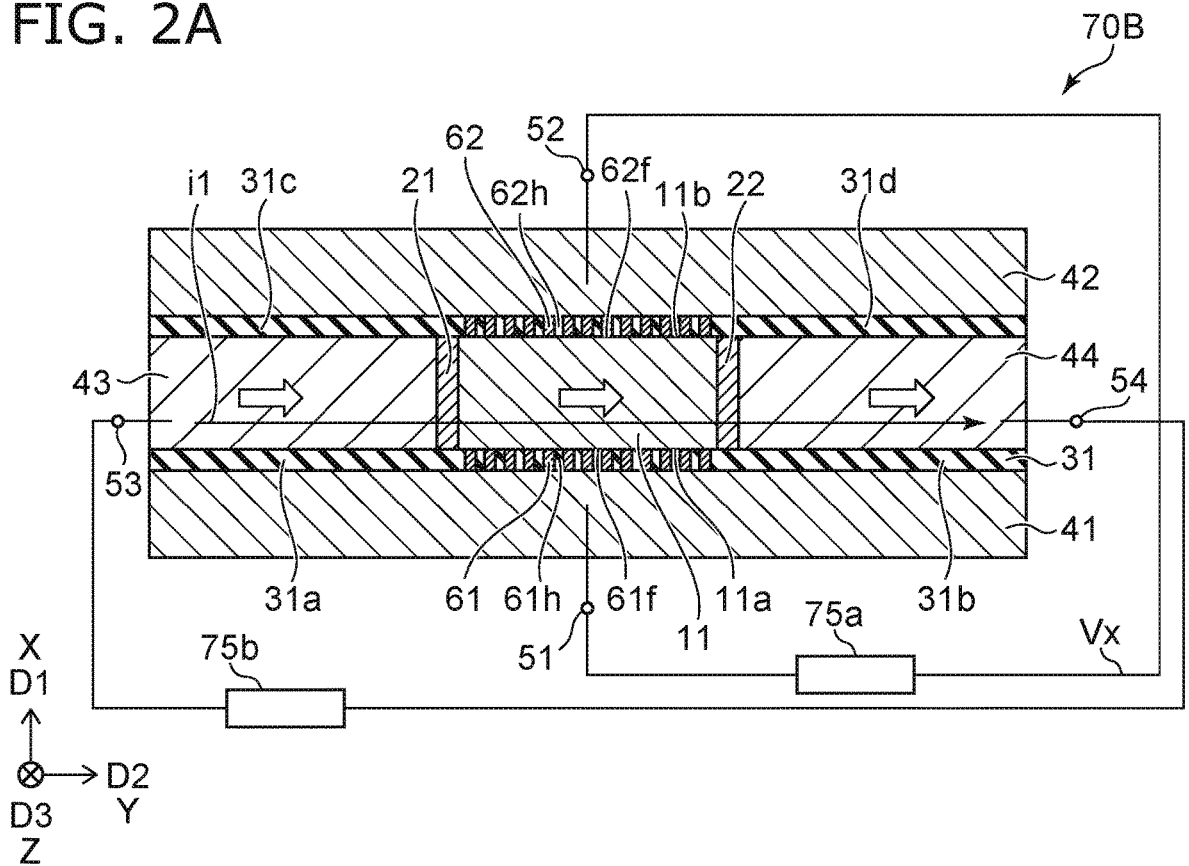
FIGS. 2A and 2B are schematic cross-sectional views illustrating the magnetic sensor according to the first embodiment.
Figure 2B:
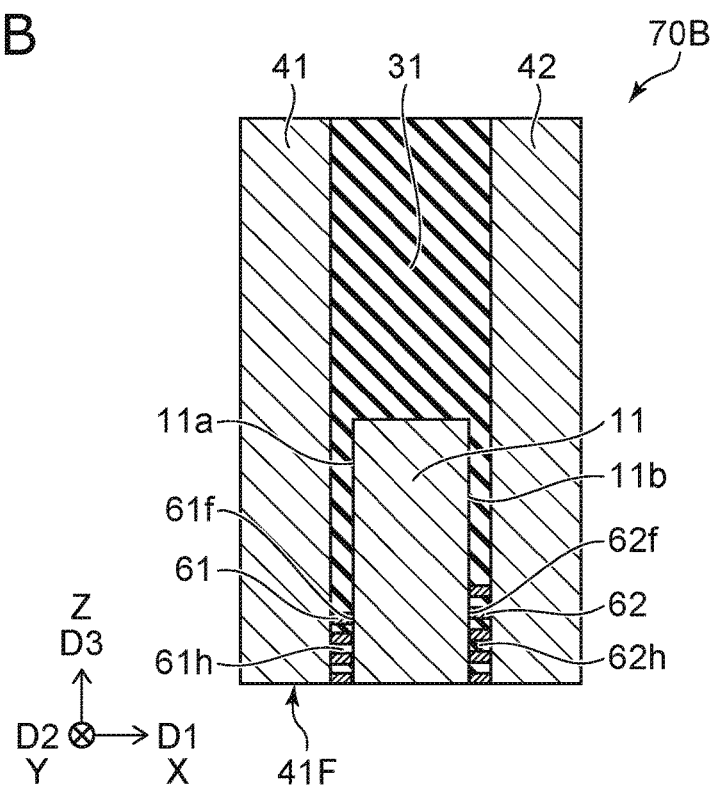

FIGS. 2A and 2B are schematic cross-sectional views illustrating the magnetic sensor according to the first embodiment.

As shown in FIGS. 2A and 2B, in a magnetic sensor 70B according to the embodiment, the first intermediate layer 61 may include a first hole 61h. The first hole 61h extends along the first direction D1. Except for this, the configuration of the magnetic sensor 70B may be the same as the configuration of the magnetic sensor 70A.

In the magnetic sensor 70B, the area of the first intermediate layer face 61f becomes smaller than the area of the first face 11a by providing the first hole 61h. A part of the first current i1 is suppressed from flowing through the first intermediate layer 61 and the first shield 41. Sensitivity can be improved.

A portion of the first insulating member 31 may be provided in the first hole 61h. A plurality of first holes 61h may be provided.

As shown in FIGS. 2A and 2B, the second intermediate layer 62 may include a second hole 62h. The second hole 62h extends along the first direction D1. By providing the second hole 62h, the area of the second intermediate layer face 62f becomes smaller than the area of the second face 11b. A part of the first current i1 is suppressed from flowing through the second intermediate layer 62 and the second shield 42. Sensitivity can be improved.

A portion of the first insulating member 31 may be provided in the second hole 62h. A plurality of second holes 62h may be provided.

Figure 3A:
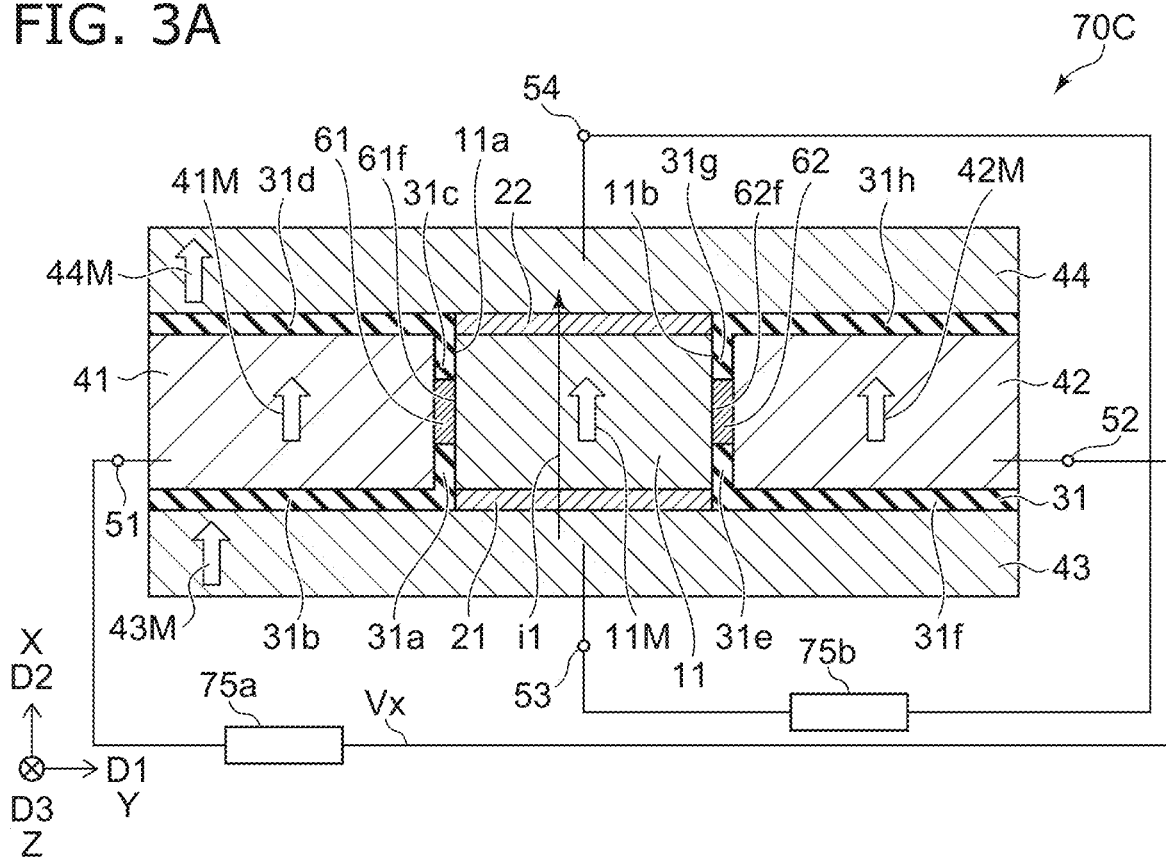
FIGS. 3A and 3B are schematic cross-sectional views illustrating the magnetic sensor according to the first embodiment.
Figure 3B:
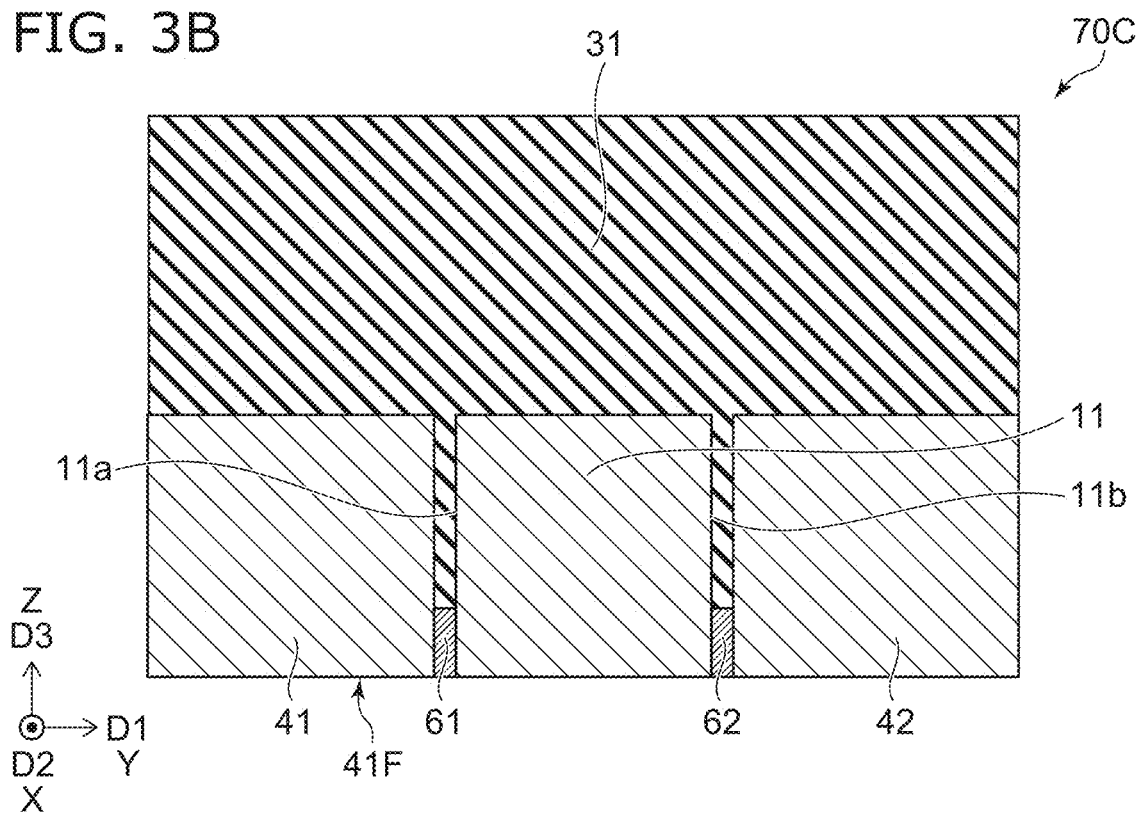

FIGS. 3A and 3B are schematic cross-sectional views illustrating the magnetic sensor according to the first embodiment.

As shown in FIG. 3A, in a magnetic sensor 70C according to the embodiment, the first shield 41 is provided between a portion of the third shield 43 and a portion of the fourth shield 44 in the second direction D2. The second shield 42 is provided between another portion of the third shield 43 and another portion of the fourth shield 44 in the second direction D2. The first direction D1 is along the Y-axis direction. The second direction D2 is along the X-axis direction. Except for this, the configuration of the magnetic sensor 70C may be the same as the configuration of the magnetic sensor 70A.

Also, in the magnetic sensor 70C, the voltage Vx between the first terminal 51 and the second terminal 52 when the first current i1 flows between the third terminal 53 and the fourth terminal 54 can be changed depending on the detection target magnetic field. Also, in the magnetic sensor 70C, the area of the first intermediate layer face 61f is smaller than the area of the first face 11a. A part of the first current i1 is suppressed from flowing through the first intermediate layer 61 and the first shield 41. Sensitivity can be improved.

As shown in FIG. 3A, in the magnetic sensor 70C, the first insulating member 31 includes the first region 31a and the second region 31b. The first region 31a is provided between the first shield 41 and a portion of the first magnetic layer 11. The second region 31b is provided between the third shield 43 and the first shield 41.

As shown in FIG. 3A, in the magnetic sensor 70C, the first insulating member 31 may further include the third region 31c and the fourth region 31d. The third region 31c is provided between the first shield 41 and another portion of the first magnetic layer 11. The fourth region 31d is provided between the first shield 41 and the fourth shield 44.

As shown in FIG. 3A, in the magnetic sensor 70C, the second intermediate layer 62 may include the second intermediate layer face 62f. The second intermediate layer face 62f faces the second face 11b. The area of the second intermediate layer face 62f is smaller than the area of the second face 11b. A part of the first current i1 is suppressed from flowing through the second intermediate layer 62 and the second shield 42. Sensitivity can be improved.

As shown in FIG. 3A, the first insulating member 31 may include a fifth region 31e and a sixth region 31f. The fifth region 31e is provided between a portion of the first magnetic layer 11 and the second shield 42. The sixth region 31f is provided between the third shield 43 and the second shield 42.

As shown in FIG. 3A, the first insulating member 31 may further include a seventh region 31g and an eighth region 31h. The seventh region 31g is provided between another portion of the first magnetic layer 11 and the second shield 42. The eighth region 31h is provided between the second shield 42 and the fourth shield 44.

Similar to the first intermediate layer 61 (see FIG. 1B), the length of the first conductive layer 21 along the third direction D3 may be shorter than the length of the first magnetic layer 11 along the third direction D3. Similar to the second intermediate layer 62 (see FIG. 1B), the length of the second conductive layer 22 along the third direction D3 may be shorter than the length of the first magnetic layer 11 along the third direction D3.

In the magnetic sensor 70C, the magnetization 11M of the first magnetic layer 11 may be along the second direction D2. The magnetization 43M of the third shield 43 may be along the second direction D2. The magnetization 44M of the fourth shield 44 may be along the second direction D2. The magnetization 43M and the magnetization 44M may have the same orientation as the magnetization 11M.

Figure 4A:
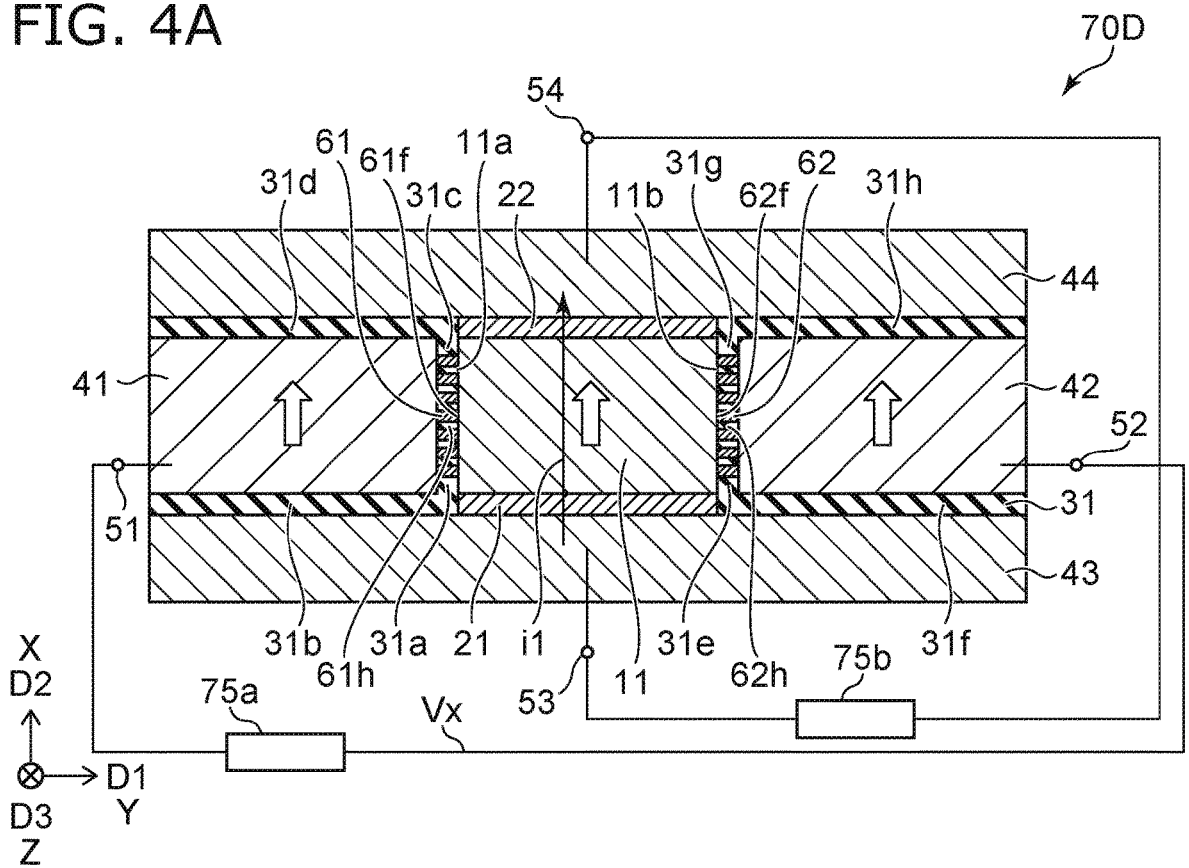
FIGS. 4A and 4B are schematic cross-sectional views illustrating the magnetic sensor according to the first embodiment.
Figure 4B:
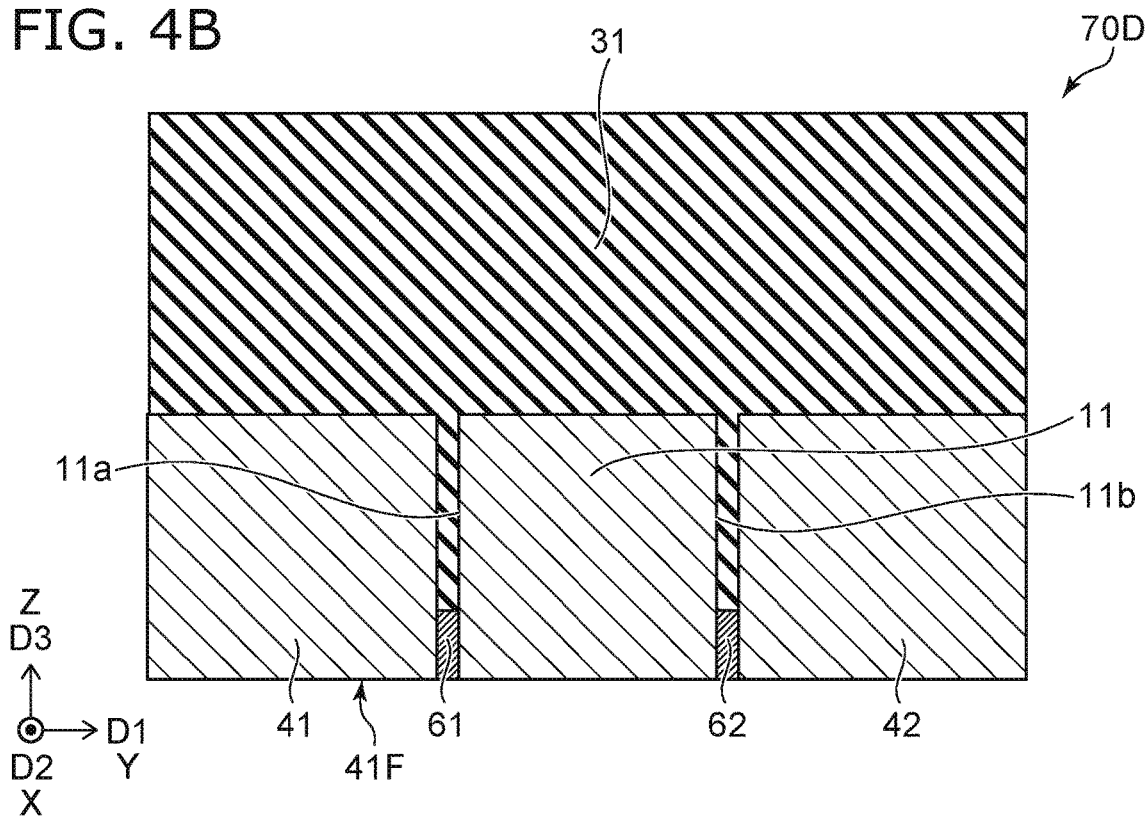

FIGS. 4A and 4B are schematic cross-sectional views illustrating the magnetic sensor according to the first embodiment.

As shown in FIGS. 4A and 4B, in a magnetic sensor 70D according to the embodiment, the first intermediate layer 61 may include a first hole 61h. The first hole 61h extends along the first direction D1. Except for this, the configuration of the magnetic sensor 70D may be the same as the configuration of the magnetic sensor 70C.

In the magnetic sensor 70D, the area of the first intermediate layer face 61f becomes smaller than the area of the first face 11a by providing the first hole 61h. A part of the first current i1 is suppressed from flowing through the first intermediate layer 61 and the first shield 41. Sensitivity can be improved.

A portion of the first insulating member 31 may be provided in the first hole 61h. A plurality of first holes 61h may be provided.

As shown in FIGS. 4A and 4B, the second intermediate layer 62 may include a second hole 62h. The second hole 62h extends along the first direction D1. By providing the second hole 62h, the area of the second intermediate layer face 62f becomes smaller than the area of the second face 11b. A part of the first current i1 is suppressed from flowing through the second intermediate layer 62 and the second shield 42. Sensitivity can be improved.

A portion of the first insulating member 31 may be provided in the second hole 62h. A plurality of second holes 62h may be provided.

Second Embodiment

Figure 5:
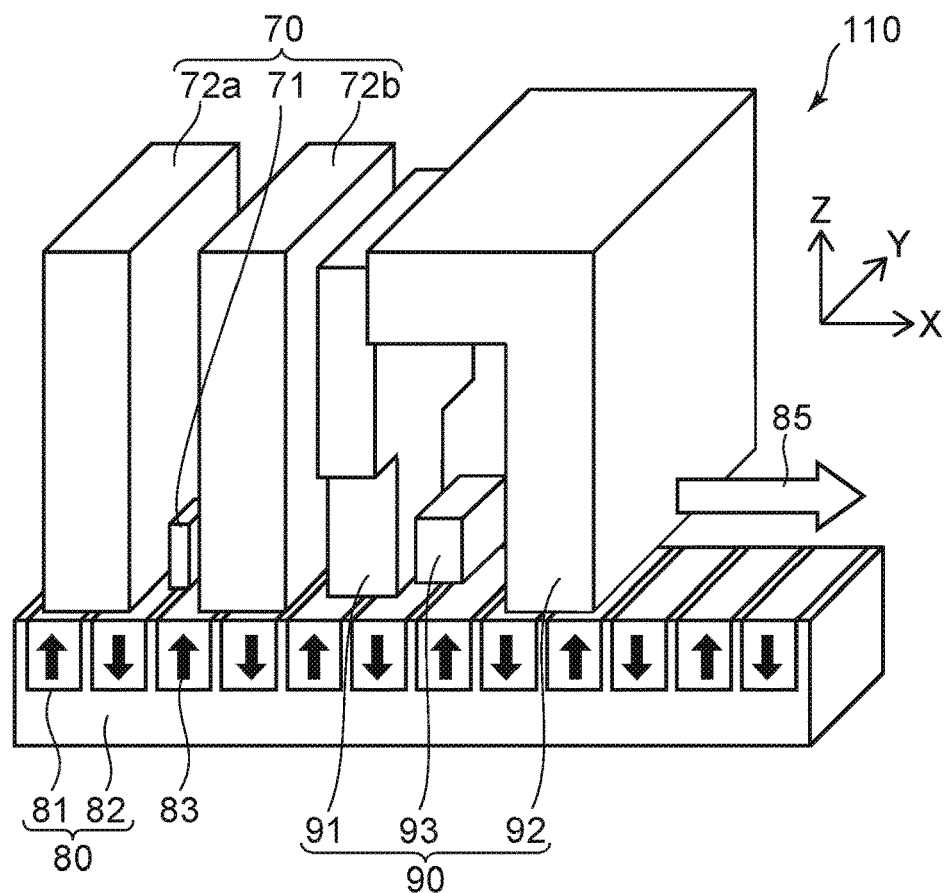
FIG. 5 is a schematic perspective view illustrating a magnetic head and a magnetic recording device according to a second embodiment.

FIG. 5 is a schematic perspective view illustrating a magnetic head and a magnetic recording device according to the second embodiment.

As shown in FIG. 5, a magnetic head 110 according to the embodiment includes a reproducing section 70. The reproducing section 70 includes a magnetic sensor (magnetic sensor 70A, magnetic sensor 70B, magnetic sensor 70C, or magnetic sensor 70D) according to the first embodiment. The magnetic head 110 is used with magnetic recording medium 80. In this example, the magnetic head 110 includes a recording section 90. Information is recorded on the magnetic recording medium 80 by the recording section 90 of the magnetic head 110. Information recorded on the magnetic recording medium 80 is reproduced by the reproducing section 70.

The magnetic recording medium 80 includes, for example, a medium substrate 82 and a magnetic recording layer 81 provided on the medium substrate 82. The magnetization 83 of the magnetic recording layer 81 is controlled by the recording section 90. The recording section 90 includes, for example, a first magnetic pole 91 and a second magnetic pole 92. The first magnetic pole 91 is, for example, the main magnetic pole. The second magnetic pole 92 is, for example, a trailing shield. The recording section 90 may include a recording section element 93. The recording section element 93 may include a magnetic field control element, a high frequency oscillation element, or the like. The recording section element 93 may be omitted.

The reproducing section 70 includes, for example, a first reproducing magnetic shield 72a, a second reproducing magnetic shield 72b, and a magnetic reproducing element 71. The magnetic reproducing element 71 is provided between the first reproducing magnetic shield 72a and the second reproducing magnetic shield 72b. The magnetic reproducing element 71 can output a signal corresponding to the magnetization 83 of the magnetic recording layer 81.

In the case where the magnetic sensor 70A or the magnetic sensor 70B is applied, the first reproducing magnetic shield 72a corresponds to, for example, one of the first shield 41 and the second shield 42; and the second reproducing magnetic shield 72b corresponds to, for example, other of the first shield 41 and the second shield 42. In the case where the magnetic sensor 70C or the magnetic sensor 70D is applied, the first reproducing magnetic shield 72a corresponds to, for example, one of the third shield 43 and the fourth shield 44; and the second reproducing magnetic shield 72b corresponds to, for example, other of the third shield 43 and the fourth shield 44. The magnetic reproducing element 71 includes the first magnetic layer 11.

As shown in FIG. 5, the magnetic recording medium 80 moves relative to the magnetic head 110 in a medium movement direction 85. Information corresponding to the magnetization 83 of the magnetic recording layer 81 is controlled at an arbitrary position by the magnetic head 110. Information corresponding to the magnetization 83 of the magnetic recording layer 81 is reproduced at an arbitrary position by the magnetic head 110.

Figure 6:
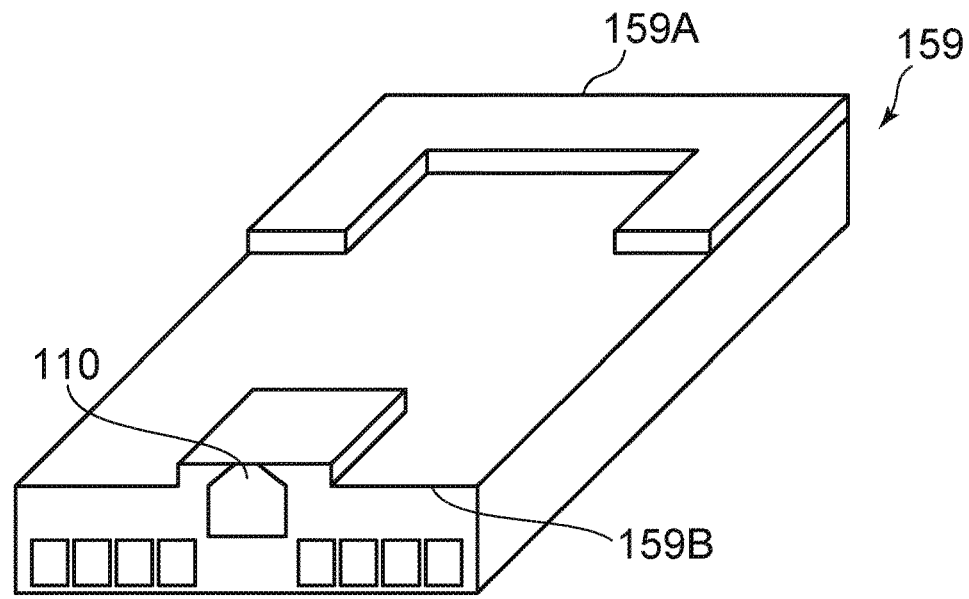
FIG. 6 is a schematic perspective view illustrating a portion of the magnetic recording device according to the embodiment.

FIG. 6 is a schematic perspective view illustrating a portion of the magnetic recording device according to the embodiment.

FIG. 6 illustrates a head slider.

The magnetic head 110 is provided on a head slider 159. The head slider 159 includes, for example, $Al_2O_3$/TIC and the like. The head slider 159 moves relative to the magnetic recording medium while floating or contacting the magnetic recording medium.

The head slider 159 includes, for example, an air inflow side 159A and an air outflow side 159B. The magnetic head 110 is arranged on the side surface of the air outflow side 159B of the head slider 159. As a result, the magnetic head 110 moves relative to the magnetic recording medium while floating or contacting the magnetic recording medium.

Figure 7:
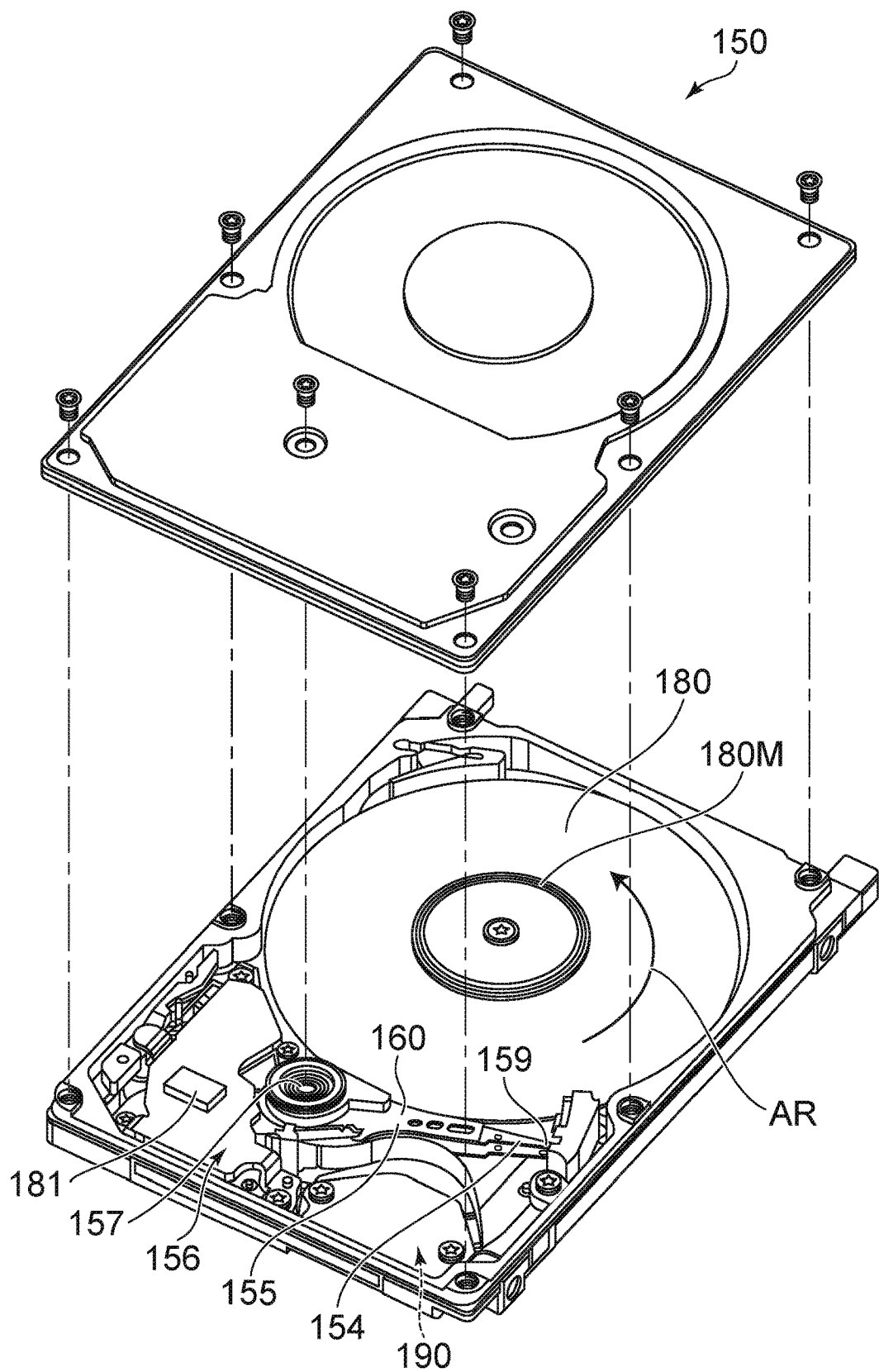
FIG. 7 is a schematic perspective view illustrating a magnetic recording device according to the embodiment.

FIG. 7 is a schematic perspective view illustrating a magnetic recording device according to the embodiment.

Figure 8A:
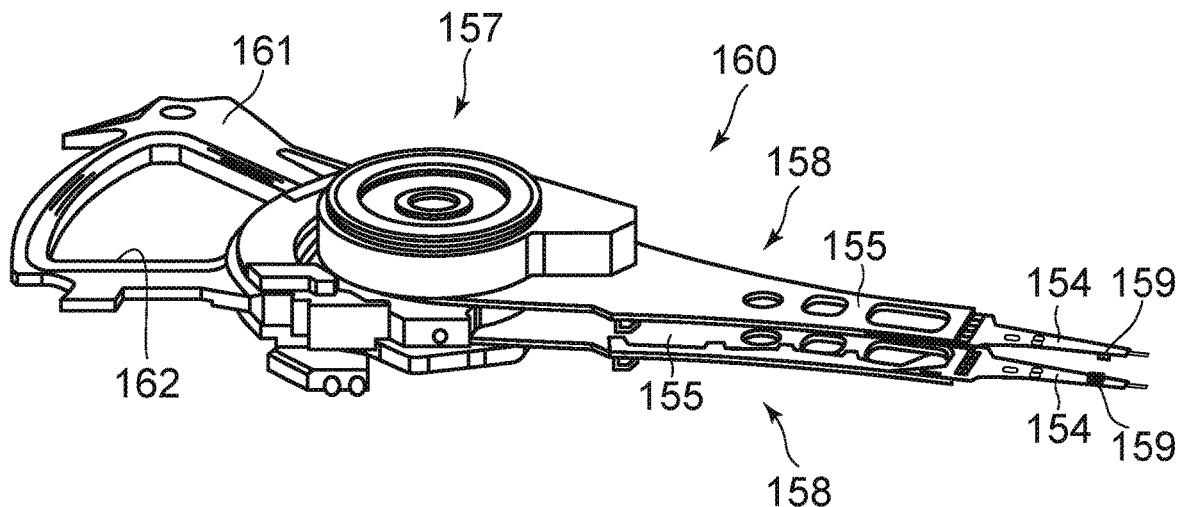
FIGS. 8A and 8B are schematic perspective views illustrating a portion of the magnetic recording device according to the embodiment.
Figure 8B:
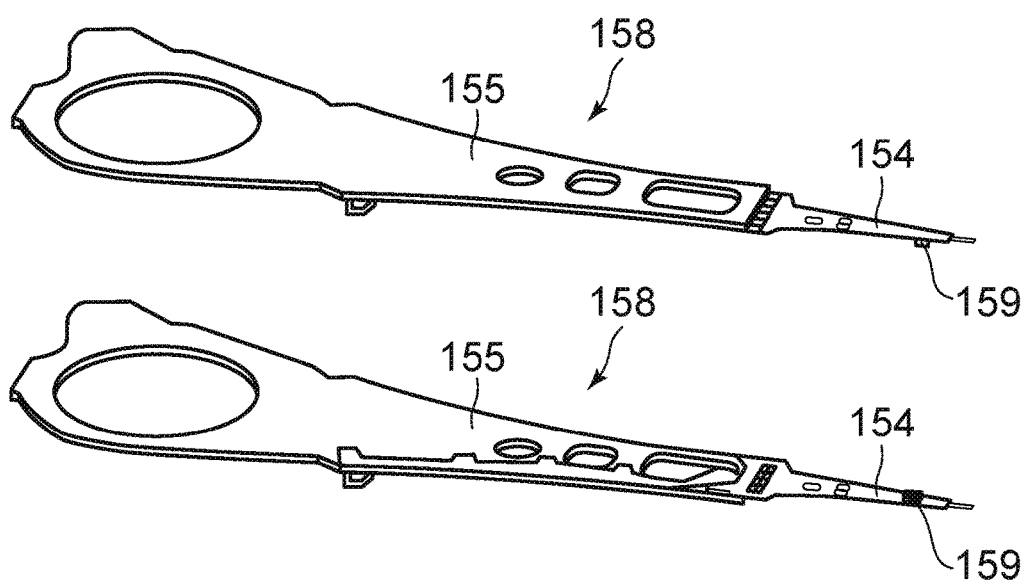

FIGS. 8A and 8B are schematic perspective views illustrating a portion of the magnetic recording device according to the embodiment.

The magnetic recording device may be a magnetic recording/reproducing device. As shown in FIG. 7, in the magnetic recording device 150 according to the embodiment, a rotary actuator is used. A recording medium disk 180 is mounted on a spindle motor 180M. The recording medium disk 180 is rotated in the direction of an arrow AR by the spindle motor 180M. The spindle motor 180M responds to a control signal from the drive device controller. The magnetic recording device 150 according to the embodiment may include multiple recording medium disks 180. The magnetic recording device 150 may include a recording medium 181. The recording medium 181 is, for example, an SSD (Solid State Drive). As the recording medium 181, for example, a non-volatile memory such as a flash memory is used. For example, the magnetic recording device 150 may be a hybrid HDD (Hard Disk Drive).

The head slider 159 records and reproduces the information to be recorded on the recording medium disk 180. The head slider 159 is provided at the tip of the thin film suspension 154. A magnetic head according to the embodiment is provided near the tip of the head slider 159.

When the recording medium disk 180 rotates, the pressing pressure by a suspension 154 and the pressure generated on the medium facing surface (ABS) of the head slider 159 are balanced. The distance between the media facing surface of the head slider 159 and the surface of the recording medium disk 180 is a predetermined fly height. In the embodiment, the head slider 159 may contact the recording medium disk 180. For example, a contact-sliding type may be applied.

The suspension 154 is connected to one end of an arm 155 (e.g., an actuator arm). The arm 155 includes, for example, a bobbin portion and the like. The bobbin portion holds a drive coil. A voice coil motor 156 is provided at the other end of the arm 155. The voice coil motor 156 is a kind of linear motor. The voice coil motor 156 includes, for example, a drive coil and a magnetic circuit. The drive coil is wound around the bobbin portion of the arm 155. The magnetic circuit includes a permanent magnet and an opposed yoke. A drive coil is provided between the permanent magnet and the opposing yoke. The suspension 154 has one end and the other end. The magnetic head is provided at one end of the suspension 154. The arm 155 is connected to the other end of the suspension 154.

The arm 155 is held by a ball bearing. Ball bearings are provided at two locations above and below the bearing part 157. The arm 155 can be rotated and slid by the voice coil motor 156. The magnetic head can be moved to an arbitrary position on the recording medium disk 180.

FIG. 8A illustrates a partial configuration of the magnetic recording device and is an enlarged perspective view of a head stack assembly 160.

FIG. 8B is a perspective view illustrating a magnetic head assembly (head gimbal assembly: HGA) 158 that is a portion of the head stack assembly 160.

As shown in FIG. 8A, the head stack assembly 160 includes the bearing part 157, the head gimbal assembly 158, and a support frame 161. The head gimbal assembly 158 extends from the bearing part 157. The support frame 161 extends from the bearing part 157. The extending direction of the support frame 161 is opposite to the extending direction of the head gimbal assembly 158. The support frame 161 supports a coil 162 of the voice coil motor 156.

As shown in FIG. 8B, the head gimbal assembly 158 includes the arm 155 extending from the bearing part 157 and the suspension 154 extending from the arm 155.

The head slider 159 is provided at the tip of the suspension 154. The head slider 159 is provided with the magnetic head according to the embodiment.

The magnetic head assembly (head gimbal assembly) 158 according to the embodiment includes the magnetic head according to the embodiment, the head slider 159 provided with the magnetic head, the suspension 154, and the arm 155. The head slider 159 is provided at one end of the suspension 154. The arm 155 is connected to the other end of the suspension 154.

The suspension 154 includes, for example, lead wires (not shown) for recording and reproducing signals. The suspension 154 may include, for example, a lead wire (not shown) for a heater for adjusting the fly height. The suspension 154 may include, for example, a lead wire (not shown) for a spin transfer torque oscillator. These lead wires and multiple electrodes provided on the magnetic head are electrically connected.

The magnetic recording device 150 is provided with a signal processor 190. The signal processor 190 records and reproduces a signal on a magnetic recording medium using a magnetic head. The input/output lines of the signal processor 190 are connected to, for example, the electrode pads of the head gimbal assembly 158, and are electrically connected to the magnetic head.

The magnetic recording device 150 according to the embodiment includes the magnetic recording medium, the magnetic head according to the embodiment, a movable part, a position controller, and the signal processor. The movable part is relatively movable in a state where the magnetic recording medium and the magnetic head are separated or brought into contact with each other. The position controller aligns the magnetic head with a predetermined recording position on the magnetic recording medium. The signal processor records and reproduces a signal on a magnetic recording medium using a magnetic head.

For example, as the above-mentioned magnetic recording medium, the recording medium disk 180 is used. The movable part includes, for example, the head slider 159. The position controller includes, for example, the head gimbal assembly 158. The embodiment may include the following configurations (e.g., technical proposals).

Configuration 1

A magnetic sensor, comprising:
a first shield;
a second shield;
a third shield;
a fourth shield, a second direction from the third shield to the fourth shield crossing a first direction from the first shield to the second shield;
a first magnetic layer provided between the first shield and the second shield, the first magnetic layer being between the third shield and the fourth shield, the first magnetic layer including a first face and a second face, the first face being between the first shield and the second face;
a first conductive layer provided between the third shield and the first magnetic layer, the first conductive layer being non-magnetic;
a second conductive layer provided between the first magnetic layer and the fourth shield, the second conductive layer being non-magnetic;
a first intermediate layer provided between the first shield and the first magnetic layer, the first intermediate layer being non-magnetic and electrically conductive, the first intermediate layer including a first intermediate layer face facing the first face, an area of the first intermediate layer face being smaller than an area of the first face; and
a second intermediate layer provided between the first magnetic layer and the second shield, the second intermediate layer being non-magnetic and electrically conductive.

Configuration 2

The sensor according to Configuration 1, further comprising:
a first terminal electrically connected to the first shield;
a second terminal electrically connected to the second shield;
a third terminal electrically connected to the third shield; and
a fourth terminal electrically connected to the fourth shield.

Configuration 3

The sensor according to Configuration 2, wherein
a voltage between the first terminal and the second terminal when a first current flows between the third terminal and the fourth terminal is configured to be changed according to a detection target magnetic field.

Configuration 4

The sensor according to any one of Configurations 1-3, wherein
at least one of the first conductive layer or the second conductive layer includes at least one selected from the group consisting of Cu, Au, Ag, Pt, Al, Pd, Ta, Ru, Hf, W, Mo, Ir, Cr, Tb, and Rh.

Configuration 5

The sensor according to any one of Configurations 1-4, wherein
the third shield is provided between a portion of the first shield and a portion of the second shield in the first direction, and
the fourth shield is provided between another portion of the first shield and another portion of the second shield in the first direction.

Configuration 6

The sensor according to Configuration 5, further comprising:
a first insulating member,
the first insulating member including a first region and a second region, the first region being provided between the first shield and the third shield, and between the first shield and a portion of the first magnetic layer, and the second region being provided between the first shield and the fourth shield, and between the first shield and another portion of the first magnetic layer.

Configuration 7

The sensor according to Configuration 5, wherein the second intermediate layer includes a second intermediate layer face facing the second face, and an area of the second intermediate layer face is smaller than an area of the second face.

Configuration 8

The sensor according to Configuration 7, further comprising:

a first insulating member, the first insulating member including a first region, a second region, a third region and a fourth region, the first region being provided between the first shield and the third shield, and between the first shield and a portion of the first magnetic layer, the second region being provided between the first shield and the fourth shield, and between the first shield and another portion of the first magnetic layer, the third region being provided between the third shield and the second shield, and between the portion of the first magnetic layer and the second shield, and the fourth region being provided between the fourth shield and the second shield, and between the other portion of the first magnetic layer and the second shield.

Configuration 9

The sensor according to Configuration 6 or 8, wherein the first insulating member includes a first element including and a second element, the first element includes at least one selected from the group consisting of oxygen and nitrogen, and the second element includes at least one selected from the group consisting of Si, Al, Ta, Hf, and Mg.

Configuration 10

The sensor according to any one of Configurations 1-4, wherein the first shield is provided between a portion of the third shield and a portion of the fourth shield in the second direction, and the second shield is provided between another portion of the third shield and another portion of the fourth shield in the second direction.

Configuration 11

The sensor according to Configuration 10, further comprising:

a first insulating member, the first insulating member including a first region and a second region, the first region being provided between the first shield and a portion of the first magnetic layer, and the second region being provided between the third shield and the first shield.

Configuration 12

The sensor according to Configuration 11, wherein the first insulating member further includes a third region and a fourth region, the third region is provided between the first shield and another portion of the first magnetic layer, and the fourth region is provided between the first shield and the fourth shield.

Configuration 13

The sensor according to Configuration 10, wherein the second intermediate layer includes a second intermediate layer face facing the second surface, and an area of the second intermediate layer face is smaller than an area of the second face.

Configuration 14

The sensor according to Configuration 13, further comprising:

a first insulating member, the first insulating member including a fifth region and a sixth region, the fifth region being provided between a portion of the first magnetic layer and the second shield, and the sixth region being provided between the third shield and the second shield.

Configuration 15

The sensor according to Configuration 14, wherein the first insulating member further includes a seventh region and an eighth region, the seventh region is provided between another portion of the first magnetic layer and the second shield, and the eighth region is provided between the second shield and the fourth shield.

Configuration 16

The sensor according to any one of Configurations 1-15, wherein the first magnetic layer includes at least one selected from the group consisting of $Co_2MnGa$, $CoMnAl$, and $FePt$.

Configuration 17

The sensor according to any one of Configurations 1-16, wherein the first intermediate layer includes a first hole extending along the first direction.

Configuration 18

The sensor according to any one of Configurations 1-16, wherein the first magnetic layer has an Anomalous Hall Effect.

Configuration 19

A magnetic head, comprising:

the magnetic sensor according to any one of Configurations 1-18.

Configuration 20

A magnetic recording device, comprising:

the magnetic head according to claim 19; and a magnetic recording medium, the magnetic sensor being configured to reproduce information recorded on the magnetic recording medium.

According to the embodiments, it is possible to provide a magnetic sensor, a magnetic head, and a magnetic recording device capable of improving resolution.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in magnetic sensors, magnetic heads and magnetic recording devices such as shields, magnetic layers, conductive regions, members, intermediate layers and terminals, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all magnetic sensors, magnetic heads, and magnetic recording devices practicable by an appropriate design modification by one skilled in the art based on the magnetic sensors, magnetic heads, and magnetic recording devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetic sensor, comprising:
a first shield;
a second shield;
a third shield;
a fourth shield, a second direction from the third shield to the fourth shield crossing a first direction from the first shield to the second shield;
a first magnetic layer provided between the first shield and the second shield, the first magnetic layer being between the third shield and the fourth shield, the first magnetic layer including a first face and a second face, the first face being between the first shield and the second face;
a first conductive layer provided between the third shield and the first magnetic layer, the first conductive layer being non-magnetic;
a second conductive layer provided between the first magnetic layer and the fourth shield, the second conductive layer being non-magnetic;
a first intermediate layer provided between the first shield and the first magnetic layer, the first intermediate layer being non-magnetic and electrically conductive, the first intermediate layer including a first intermediate layer face facing the first face, an area of the first intermediate layer face being smaller than an area of the first face; and
a second intermediate layer provided between the first magnetic layer and the second shield, the second intermediate layer being non-magnetic and electrically conductive.

2. The sensor according to claim 1, further comprising:
a first terminal electrically connected to the first shield;
a second terminal electrically connected to the second shield;
a third terminal electrically connected to the third shield; and
a fourth terminal electrically connected to the fourth shield.

3. The sensor according to claim 2, wherein
a voltage between the first terminal and the second terminal when a first current flows between the third terminal and the fourth terminal is configured to be changed according to a detection target magnetic field.

4. The sensor according to claim 1, wherein
at least one of the first conductive layer or the second conductive layer includes at least one selected from the group consisting of Cu, Au, Ag, Pt, Al, Pd, Ta, Ru, Hf, W, Mo, Ir, Cr, Tb, and Rh.

5. The sensor according to claim 1, wherein
the third shield is provided between a portion of the first shield and a portion of the second shield in the first direction, and
the fourth shield is provided between another portion of the first shield and another portion of the second shield in the first direction.

6. The sensor according to claim 5, further comprising:
a first insulating member,
the first insulating member including a first region and a second region,
the first region being provided between the first shield and the third shield, and between the first shield and a portion of the first magnetic layer, and
the second region being provided between the first shield and the fourth shield, and between the first shield and another portion of the first magnetic layer.

7. The sensor according to claim 6, wherein
the first insulating member includes a first element including and a second element, the first element includes at least one selected from the group consisting of oxygen and nitrogen, and the second element includes at least one selected from the group consisting of Si, Al, Ta, Hf, and Mg.

8. The sensor according to claim 5, wherein
the second intermediate layer includes a second intermediate layer face facing the second face, and
an area of the second intermediate layer face is smaller than an area of the second face.

9. The sensor according to claim 8, further comprising:
a first insulating member,
the first insulating member including a first region, a second region, a third region and a fourth region,
the first region being provided between the first shield and the third shield, and between the first shield and a portion of the first magnetic layer,
the second region being provided between the first shield and the fourth shield, and between the first shield and another portion of the first magnetic layer,
the third region being provided between the third shield and the second shield, and between the portion of the first magnetic layer and the second shield, and
the fourth region being provided between the fourth shield and the second shield, and between the other portion of the first magnetic layer and the second shield.

10. The sensor according to claim 1, wherein
the first shield is provided between a portion of the third shield and a portion of the fourth shield in the second direction, and
the second shield is provided between another portion of the third shield and another portion of the fourth shield in the second direction.

11. The sensor according to claim 10, further comprising:
a first insulating member,
the first insulating member including a first region and a second region,
the first region being provided between the first shield and a portion of the first magnetic layer, and
the second region being provided between the third shield and the first shield.

12. The sensor according to claim 11, wherein
the first insulating member further includes a third region and a fourth region,
the third region is provided between the first shield and another portion of the first magnetic layer, and
the fourth region is provided between the first shield and the fourth shield.

13. The sensor according to claim 10, wherein
the second intermediate layer includes a second intermediate layer face facing the second surface, and
an area of the second intermediate layer face is smaller than an area of the second face.

14. The sensor according to claim 13, further comprising:
a first insulating member,
the first insulating member including a fifth region and a sixth region,
the fifth region being provided between a portion of the first magnetic layer and the second shield, and
the sixth region being provided between the third shield and the second shield.

15. The sensor according to claim 14, wherein
the first insulating member further includes a seventh region and an eighth region,
the seventh region is provided between another portion of the first magnetic layer and the second shield, and
the eighth region is provided between the second shield and the fourth shield.

16. The sensor according to claim 1, wherein
the first magnetic layer includes at least one selected from the group consisting of $Co_2MnGa$, CoMnAl, and FePt.

17. The sensor according to claim 1, wherein
the first intermediate layer includes a first hole extending along the first direction.

18. The sensor according to claim 1, wherein
the first magnetic layer has an Anomalous Hall Effect.

19. A magnetic head, comprising:
the magnetic sensor according to claim 1.

20. A magnetic recording device, comprising:
the magnetic head according to claim 19; and
a magnetic recording medium,
the magnetic sensor being configured to reproduce information recorded on the magnetic recording medium.

21. The sensor according to claim 1, wherein
at least one of the first conductive layer or the second conductive layer includes at least one selected from the group consisting of Ta, W, Hf, and Mo.

22. The sensor according to claim 1, wherein
at least one of the first conductive layer or the second conductive layer includes at least one selected from the group consisting of Pt, Pd, Au, Ag, Ru, Ir, and Rh.

23. The sensor according to claim 1, wherein
at least one of the first conductive layer or the second conductive layer includes at least one selected from the group consisting of Cu, Al, Tb, and Cr.

* * * * *